United States Patent [19]
Daniel et al.

[11] Patent Number: 5,684,795
[45] Date of Patent: Nov. 4, 1997

[54] METHOD AND APPARATUS FOR CONTROLLING A FRACTIONAL-N SYNTHESIZER IN A TIME DIVISION MULTIPLE ACCESS SYSTEM

[75] Inventors: Christopher John Daniel, Lake Zurich; Thomas J. Kovarik, Grayslake; Robert Scott Swenson, Hoffman Estates, all of Ill.

[73] Assignee: Motorola, Inc., Schaumburg, Ill.

[21] Appl. No.: 594,098

[22] Filed: Jan. 30, 1996

[51] Int. Cl.$^6$ ............................................. H04J 3/06
[52] U.S. Cl. ................... 370/347; 370/516; 375/371; 455/76; 455/260; 331/1 A
[58] Field of Search .................... 370/252, 314, 370/321, 330, 337, 347, 350, 436, 437, 442, 458, 478, 480, 481, 482, 484, 503, 516, 517, 518; 375/371, 373, 375, 376, 202; 455/76, 87, 86, 183.1, 259, 260, 181.1, 182.2, 182.1, 183.2, 184.1, 185.1, 186.1; 331/1 A, 1 R, 18, 179, 25; 332/100, 101, 103, 123, 126, 127, 128; 327/105, 7, 8, 106, 107, 113, 117, 118, 39, 40, 41, 42, 43, 44, 45, 46

[56] References Cited

U.S. PATENT DOCUMENTS

| | | |
|---|---|---|
| 4,816,774 | 3/1989 | Martin . |
| 4,918,403 | 4/1990 | Martin . |
| 5,065,408 | 11/1991 | Gillig .......................... 331/1 A |
| 5,111,162 | 5/1992 | Hietala et al. ................. 455/76 |
| 5,122,762 | 6/1992 | Molina et al. ............... 331/1 A |
| 5,541,929 | 7/1996 | Jokura ........................ 370/337 |

Primary Examiner—Wellington Chin
Assistant Examiner—Huy D. Vu
Attorney, Agent, or Firm—Richard A. Sonnentag

[57] ABSTRACT

In a Time Division Multiple Access System, multiple offset values are provided to a divider control circuit (213) of a fractional-N synthesizer (200) by utilizing a microprocessor (305). The microprocessor (305) utilizes timeslot information provided to it by a timeslot selector (301), frequency information provided to it by a frequency selector (303) and a read-only memory (307), to provide offset values to the divider control circuit (213).

12 Claims, 3 Drawing Sheets

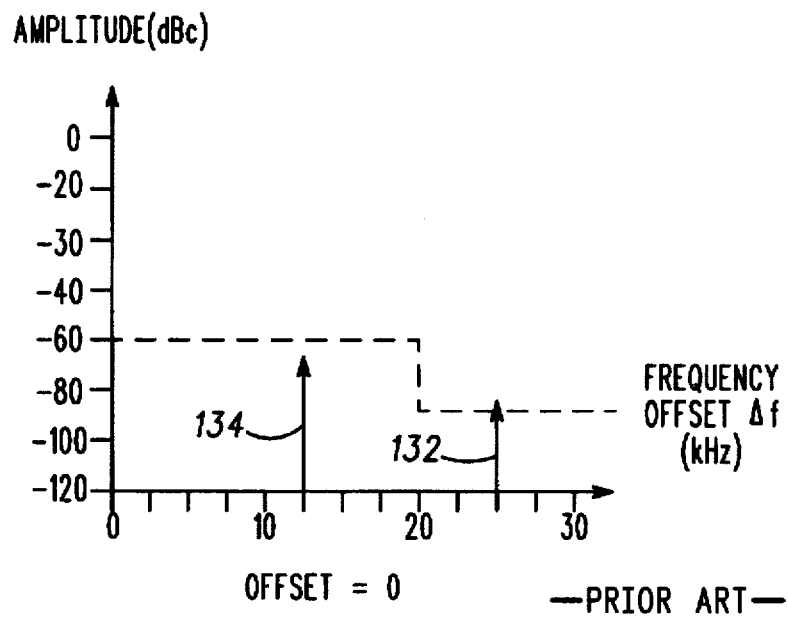
FIG.1 —PRIOR ART—
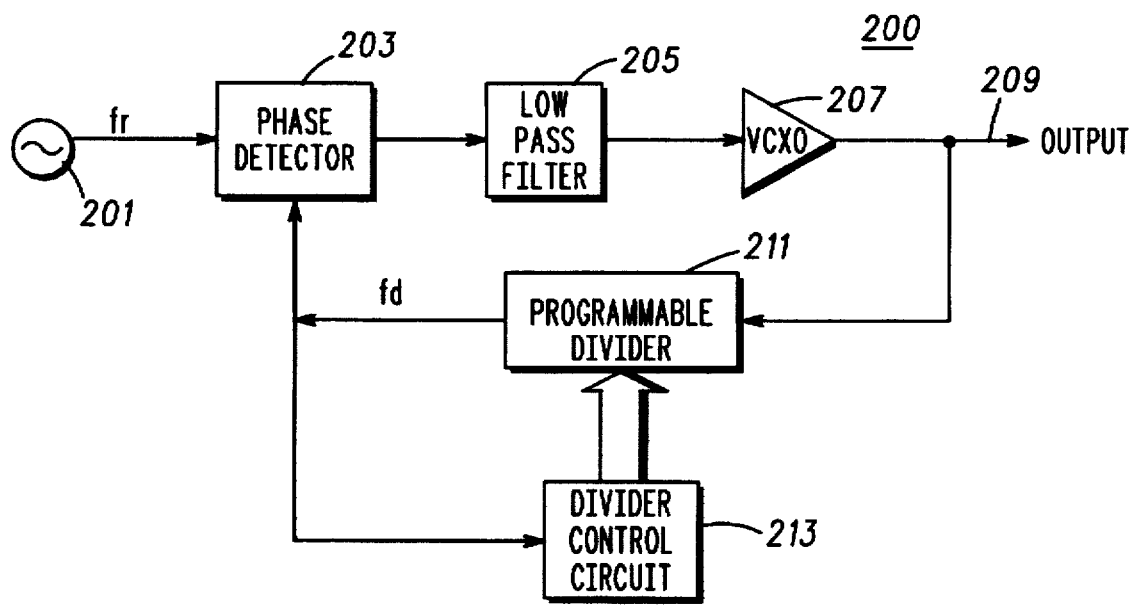
FIG.2 —PRIOR ART—

METHOD AND APPARATUS FOR CONTROLLING A FRACTIONAL-N SYNTHESIZER IN A TIME DIVISION MULTIPLE ACCESS SYSTEM

FIELD OF THE INVENTION

The present invention relates generally to fractional-N frequency synthesizers and, in particular, to control offsets of a fractional-N synthesizer in a Time Division Multiple Access system.

BACKGROUND OF THE INVENTION

Frequency divider circuits are commonly used in Time Division Multiple Access (TDMA) frequency synthesizer circuits (such as a phase lock loop (PLL)). TDMA systems are well known in the art, and described, for example in Global System for Mobile Communications (GSM) standard. In a fractional-N synthesis PLL circuit, the output frequency $f_o$ of a voltage controlled oscillator (VCO) is first divided and then applied to a phase detector which operates in a conventional manner comparing the phase of the divided output signal with a reference frequency $f_r$ from a reference oscillator, in order to control the VCO output frequency $f_o$. The output frequency $f_o$ is related to the reference frequency of the reference frequency source by the relationship $fo=(NF)xf_r$, where NF is the effective divisor by which the output frequency is divided before it is compared with the reference frequency. NF is produced by a divider control circuit and consists of an integer part N and a fractional part F. The fractional part $F=k/D$ where k and D are both integers.

Since a divider operates with integer values, fractional division is simulated by switching between different integer values of divisors. However, this switching of the divisors results in spurious sidebands in the synthesized output frequency signal $f_o$. The goal in designing a synthesizer is to keep the amplitudes of these spurious signals below some maximum acceptable limit.

An approach, illustrated in U.S. Pat. No. 4,204,174, to cancel unwanted spurious signals utilizes two accumulators to simulate the fractional division and a digital-to-analog converter to generate a correction signal to back-off the resultant spurious sidebands. U.S. Pat. No. 4,694,475 also illustrates the use of two accumulators for a frequency divider circuit. Basically, both methods utilize a first accumulator to correct the phase error and a second accumulator to which the instantaneous contents of the first accumulator is summed at each cycle of the divider output. For each clock cycle in which the second accumulators fixed capacity D is reached, the divisor is increased by one from its programmed value. On each succeeding clock cycle, the divisor N is decreased by one from its programmed value. The net effect on the average divisor is zero since counts are always added and subtracted in pairs. Such two accumulator approaches provide a single unique wave form and associated spurious response for each value of numerator k of the fractional part of the divider and capacity D of the accumulators for a synthesizer of a predetermined loop bandwidth. This unique wave form can result in unacceptable spurious signals for a desired output frequency $f_o$. In particular, a two accumulator fractional-N synthesizer typically generates spurs with varying amplitude depending on the offset of the initial value of the second accumulator with respect to the first accumulator. In certain TDMA applications, spurious signals within 20 kHz of a desired frequency $f_o$ must be 60 dB below the carrier $f_o$ frequency signal while spurious signals further than 20 kHz from the carrier frequency must be 90 dB below the carrier level. With the wave form provided by prior art two accumulator approaches, the spurious signals can exceed the desired limits. FIG. 1 illustrates such a situation. In this illustration, spur 134 is within desired limits, however, spur 132 exceeds desired limits.

Thus a need exists for a fractional-N synthesizer which reduces spurious signals in the synthesized output frequency $f_o$.

BRIEF DESCRIPTION OF THE DRAWINGS

FIG. 1 illustrates an example of the frequency response of a two accumulator synthesizer in accordance with the prior art approaches.

FIG. 2 illustrates a block diagram of a prior-art fractional-N synthesizer with spur compensation which can utilize a preferred embodiment of the present invention.

DESCRIPTION OF A PREFERRED EMBODIMENT

Figure 3:
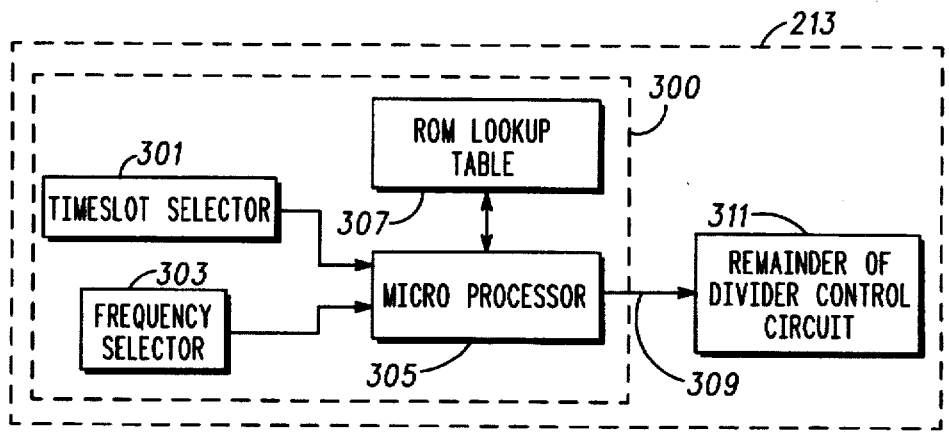
FIG. 3 illustrates a block diagram of a controller for controlling the divider control circuit of a fractional-N synthesizer in accordance with a preferred embodiment of the present invention.

The preferred embodiment of the present invention reduces unacceptable spurious signals in the synthesized output frequency $f_o$ of a fractional-N synthesizer by dynamically providing multiple offsets to a divider control circuit. The multiple offsets are provided to the divider control circuit of a fractional-N synthesizer by a microprocessor. The microprocessor utilizes timeslot information provided to it by a timeslot selector, frequency information provided to it by a frequency selector, and a table stored in memory to provide dynamically changing offset values to the divider control circuit. Dynamically changing the offset used in the fractional-N synthesizer at the beginning of each timeslot will result in the spurious response (when viewed over time) to be an average of the spurious responses for each offset, in many cases substantially reducing the spurious response when viewed over time.

Generally, the preferred embodiment of the present invention encompasses a method for controlling a fractional-N synthesizer in a time division multiple access (TDMA) system by receiving timeslot and frequency information of the TDMA system and determining an offset value based on the timeslot and the frequency information. The offset is then output to a divider control circuit of the fractional-N synthesizer.

An alternative embodiment of the present invention encompasses a method for determining an offset value to be used in a fractional-N synthesizer of a TDMA system by receiving a current timeslot and frequency being utilized by the TDMA system and accessing a lookup table to obtain a list of potential offsets, where the list of potential offsets is based on the current frequency. Finally an offset is determined based on the list of potential offsets and the current timeslot.

FIG. 2 illustrates a block diagram of a prior-art fractional-N synthesizer with spur compensation which can utilize a preferred embodiment of the present invention. The frequency synthesizer 200 includes a reference oscillator 201, a phase detector 203, a low pass filter 205, a voltage controlled oscillator (VCO) 207, a programmable divide by N divider 211, and a divider control circuit 213. The output of reference oscillator 201 $f_r$ is applied to the phase detector 203 that has its output coupled, via a low pass filter 205, to the voltage controlled oscillator 207. The output of the VCO 207 is connected to the output 209 of the frequency synthesizer 200 and to the programmable divide by N divider 211. The output of divider 211 provides a divided signal $f_d$ to the phase detector 203 and to a divider control circuit 213. Divider control circuit 213 is connected to the programmable divider 211 and provides the divide or "N" information used by the divider 211.

FIG. 3 illustrates a block diagram of a controller for controlling the divider control circuit of a fractional-N synthesizer in accordance with a preferred embodiment of the present invention. The controller 300 comprises a microprocessor 305, a lookup table in memory 307, a frequency selector 303, and a timeslot selector 301. The output from the timeslot selector 301 as well as the output from the frequency selector 303 are input into the microprocessor 305. The microprocessor 305 is coupled to a—memory (or lookup table) 307, and has an output 309 to the remainder of the divider control circuit 311. As described in U.S. Pat. No. 4,816,774, incorporated by reference herein, the remainder of the divider control circuit 311 preferably comprises well known circuitry, such as a data register, accumulators, multiplexers, offset control circuitry, and a control logic unit.

Operation of the controller 300 in accordance with a preferred embodiment of the present invention occurs as follows. The timeslot selector 301 provides the microprocessor 305 with the current timeslot being utilized by a TDMA transmitter/receiver and the frequency selector 303 provides the microprocessor 305 with the current frequency being utilized by a TDMA transmitter/receiver. Once the microprocessor 305 has acquired the frequency and timeslot information of the TDMA system, the microprocessor 305 accesses the lookup table in memory 307 to determine a list of potential offset values for use in the divider control circuit 213. The microprocessor 305 then utilizes the list of offset values, the current timeslot, and the current frequency, to determine an offset value. The microprocessor 305 then outputs the offset value to the remainder of the divider control circuit 311.

Figure 4:
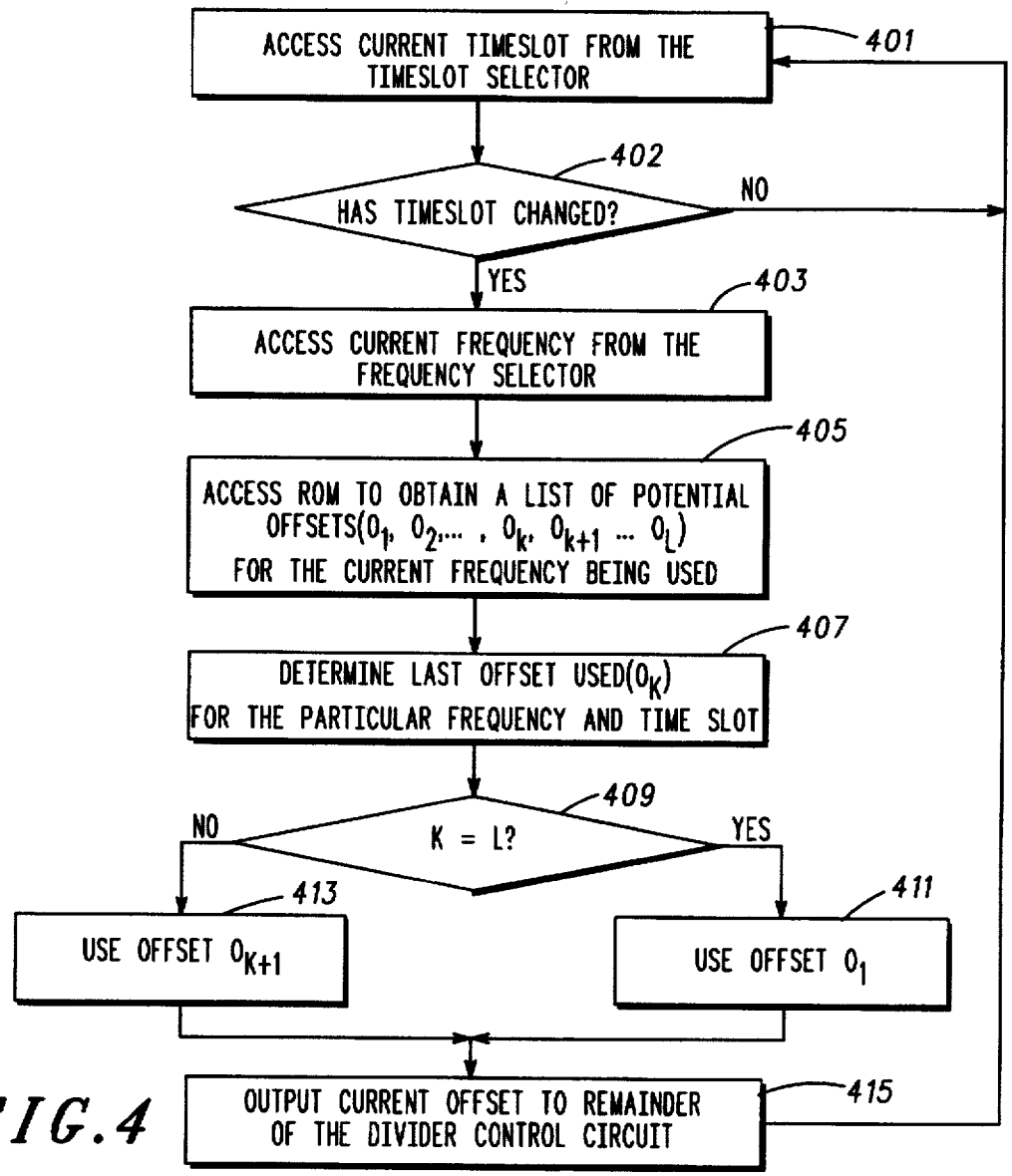
FIG. 4 illustrates a logic flow diagram illustrating steps executed by the microprocessor of a fractional-N synthesizer of FIG. 3 in accordance with a preferred embodiment of the present invention.

FIG. 4 illustrates a logic flow diagram illustrating steps executed by the microprocessor of a fractional-N synthesizer of FIG. 3 in accordance with a preferred embodiment of the present invention. At step 401, the microprocessor 305 receives from the timeslot selector 301, the current timeslot being utilized by the TDMA transmitter/receiver. At step 402, it is determined if the current timeslot has changed since step 402 was last executed. If not, the logic flow returns to step 401. If the current timeslot has changed since step 402 was last executed, then at step 403, the microprocessor 305 receives from the frequency selector 303, the current frequency being utilized by the TDMA transmitter/receiver. Next, at step 405 the memory is accessed to obtain a list of potential offsets ($o_1, o_2, \ldots o_K, o_{K+1} \ldots o_L$) for the current frequency being used. At step 407, the previous offset used ($o_K$) for the particular frequency and timeslot is determined. At step 409, it is determined if the previous offset used for the particular frequency and timeslot was the last offset in the list of offsets ($o_L$) and if so, at step 411, the current offset is set to the first offset in the list of potential offsets ($o_1$). If the previous offset used for the particular frequency and timeslot was not the last offset in the lists of offsets, then, at step 413, the current offset is set to the next offset in the list of offsets ($o_{K+1}$). At step 415, the current offset value is output to the remainder of the divider control circuit, and the logic flow returns to step 410.

Because the offsets ($o_1, o_2, \ldots o_K, o_{K+1} \ldots o_L$) for a particular frequency in a TDMA system will be periodic, the storage of the offsets can be limited to a single period to save memory. In the preferred embodiment, the offsets are stored in a two-dimensional array, where the first index is the particular frequency, and the second index is the particular offset. For example, a system capable of operating at A=26 different frequencies, having L=2 offsets per frequency will require a total of A×L=52 offsets. In order for a processor to efficiently locate the correct offset needed for a particular frequency and timeslot, the offsets can be stored in an A×L two dimensional lookup table where the first index is the particular frequency (F1, F2, F3, ..., FA) and the second index is the particular offsets being utilized ($o_1, o_2, \ldots, o_L$).

Figure 5:
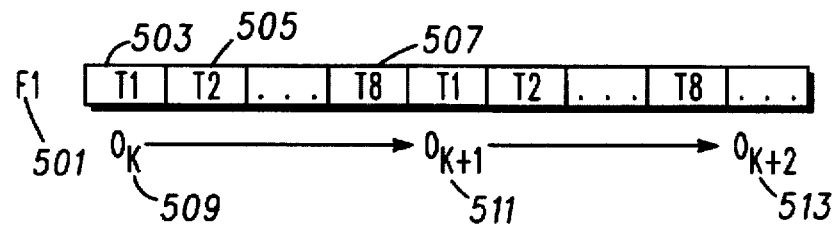
FIG. 5 illustrates timeslots in a Time Division Multiple Access system, with corresponding offset values in accordance with a preferred embodiment of the present invention.

FIG. 5 illustrates timeslots in a TDMA system, with corresponding offset values in accordance with a preferred embodiment of the present invention. In a GSM based eight timeslot TDMA system, a voice channel may be assigned to each timeslot. When no frequency hopping is used, the transmit and receive synthesizers are programmed to the same frequency for the voice channel assigned to a particular timeslot. As is shown in FIG. 5, offset values 509–513 are changed every eight timeslots. Dynamically changing the offset values 509–513 used in the fractional-N synthesizer every eight timeslots results in the spurious response (when viewed over time) to be an average of the spurious responses for each offset. In a non-frequency hopping environment, improvements in spurious responses may be seen when the system is looked at with reference to time (continuous output from the synthesizer) as well as when viewed over a single timeslot through multiple frames (a single mobile station's performance). This is shown in Table 1.

TABLE 1

Comparison of Fractional Spurs

| | Measured Spur Level | | | Change |
|---|---|---|---|---|
| Spur Frequency (±kHz) | Optimum Offset Offset = 9 (dBc) | Alternate Offset Offset = 11 (dBc) | Calculated Average Spur Level (dBc) | From Optimum Offset (dB) |
| 50 | −94.0 | −94.0 | −94.0 | 0.0 |
| 100 | −43.5 | −37.6 | −39.6 | +3.9 |
| 150 | −94.0 | −94.0 | −94.0 | 0.0 |
| 200 | −58.2 | −60.8 | −59.3 | −1.1 |
| 250 | −94.0 | −94.0 | −94.0 | 0.0 |
| 300 | −55.8 | −65.8 | −58.4 | −2.6 |
| 350 | −94.0 | −94.0 | −94.0 | 0.0 |
| 400 | −77.9 | −72.7 | −74.6 | +3.3 |
| 450 | −94.0 | −94.0 | −94.0 | 0.0 |
| 500 | −79.4 | −71.2 | −73.6 | +5.8 |
| 550 | −94.0 | −94.0 | −94.0 | 0.0 |
| 600 | −80.1 | −87.8 | −82.4 | −2.3 |
| 650 | −94.0 | −94.0 | −94.0 | 0.0 |
| 700 | −78.6 | −89.3 | −81.3 | −2.7 |
| 750 | −94.0 | −94.0 | −94.0 | 0.0 |
| 800 | −91.8 | −90.6 | −91.2 | +0.6 |
| 850 | −94.0 | −94.0 | −94..0 | 0.0 |
| 900 | −90.0 | −94.0 | −91.6 | −1.6 |
| 950 | −94.0 | −94.0 | −94.0 | 0.0 |

Table 1 compares the measured fractional spur levels for two accumulator offset values (9 and 11) with the calculated averaged fractional spur levels which would result from the preferred embodiment. All measurements are made with reference to a −94 dBc measurement floor. The last column indicates the change in fractional spur level between using offset value 9 and averaging offsets 9 and 11 (a negative number indicates a reduction in spur level).

Figure 6:
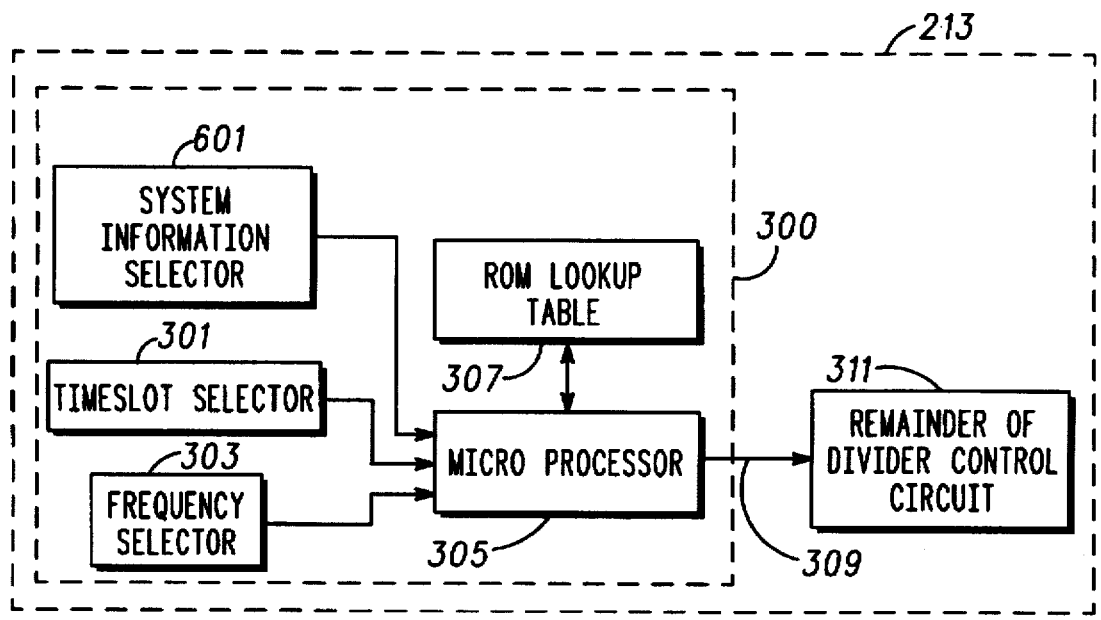
FIG. 6 is a block diagram that shows an alternate embodiment of a controller in a fractional-N synthesizer of FIG. 2 in accordance with the present invention.

FIG. 6 is a block diagram that shows an alternate embodiment of a controller in a fractional-N synthesizer of FIG. 2 in accordance with the present invention. As shown in FIG. 6, the operating condition is supplied to the microprocessor 305 via a system information selector 601 in addition to frequency and timeslot information. Operation of the controller 300 in accordance with the preferred embodiment of the present invention occurs as follows. The timeslot selector 301 provides the microprocessor 305 with the current timeslot being utilized by a TDMA transmitter/receiver and the frequency selector 303 provides the microprocessor 305 with the current frequency being utilized by the TDMA transmitter/receiver. Additionally system information (such as required spur performance) is supplied to the microprocessor 305 via the system information selector 601. Once the microprocessor 305 has acquired the system information, frequency and timeslot information of the TDMA system, the microprocessor 305 accesses a lookup table in memory 307 to determine a list of potential offset values for use in the divider control circuit 213. The microprocessor 305 then utilizes the list of offset values, the system information, current timeslot, and the current frequency, to determine an offset value. The microprocessor 305 then outputs the offset value to the remainder of the divider control circuit 311. Incorporating system information into the determination of what offsets to utilize may improve spurious performance that is dependent on operating conditions. For example, under low signal-to-noise conditions the low frequency spurs may more adversely affect a receiver's performance. An accumulator offset may be selected to provide a fractionalization of spurious response which is best for that particular operating condition.

The descriptions of the invention, the specific details, and the drawings mentioned above, are not meant to limit the scope of the present invention. For example, in addition to utilizing the present invention in a non-frequency hopping environment, the invention may be implemented in a frequency hopping environment. It is the intent of the inventors that various modifications can be made to the preferred embodiments of the present invention disclosed herein without varying from the spirit and scope of the present invention, and it is intended that all such modifications come within the scope of the following claims.

What is claimed is:

1. A method for controlling a fractional-N synthesizer in a time division multiple access (TDMA) system, comprising the steps of:

receiving timeslot information of the TDMA system;

receiving frequency information of the TDMA system;

determining an offset value based on the timeslot and the frequency information; and outputting the offset value to a divider control circuit of the fractional-N synthesizer.

2. The method of claim 1, wherein the step of determining comprises the steps of:

accessing a memory to obtain a list of potential offset values for use in the fractional-N synthesizer, the list of potential offset values based on the frequency information; and determining the offset value based on the timeslot information and the list of potential offset values.

3. The method of claim 1, wherein the timeslot information comprises a current timeslot being utilized by the TDMA system.

4. The method of claim 1, wherein the frequency information comprises a current frequency being utilized by the TDMA system.

5. The method of claim 2, wherein the list of potential offsets is further based on a table of available offsets and a previously used offset.

6. The method of claim 1, further comprising the steps of:

receiving system information of the TDMA system; and determining the offset value for use in the fractional-N synthesizer based on the timeslot information, the frequency information, and the system information.

7. A method for determining an offset value to be used in a fractional-N synthesizer of a TDMA system, comprising the steps of:

receiving a current timeslot being utilized by the TDMA system;

receiving a current frequency being utilized by the TDMA system;

accessing a lookup table to obtain a list of potential offsets, the list of potential offsets is based on the current frequency; and determining an offset based on the list of potential offsets and the current timeslot.

8. The method of claim 7, wherein the step of determining an offset comprises the steps of:

determining a previous offset utilized for the current timeslot and the current frequency; and selecting a second offset from the list of potential offsets, the second offset differing from the previous offset.

9. An apparatus for use with a fractional-N synthesizer in a TDMA system, comprising:

a timeslot selector providing timeslot information associated with the TDMA system;

a frequency selector coupled to the timeslot selector, providing frequency information associated with the TDMA system;

a memory lookup table, the memory lookup table comprising a list of potential offset values for use in the fractional-N synthesizer; and a controller responsive to the timeslot selector, the frequency selector, and the memory lookup table, the controller providing offset values for use in the fractional-N synthesizer.

10. The apparatus of claim 9, wherein the timeslot information comprises a current timeslot being utilized by the TDMA system.

11. The apparatus of claim 9, wherein the frequency information comprises a current frequency being utilized by the TDMA system.

12. The apparatus of claim 9 further comprising a system information selector.

* * * * *